US012652802B2

(12) United States Patent (10) Patent No.: US 12,652,802 B2
Sumiya et al. (45) Date of Patent: Jun. 9, 2026

(54) METHOD FOR MANUFACTURING SEMICONDUCTOR DEVICE

(71) Applicant: Kioxia Corporation, Tokyo (JP)

(72) Inventors: Mariko Sumiya, Yokkaichi Mie (JP); Ryosuke Yamamoto, Nagoya Aichi (JP)

(73) Assignee: KIOXIA CORPORATION, Tokyo (JP)

( * ) Notice: Subject to any disclaimer, the term of this patent is extended or adjusted under 35 U.S.C. 154(b) by 325 days.

(21) Appl. No.: 18/446,583

(22) Filed: Aug. 9, 2023

(65) Prior Publication Data

US 2024/0099009 A1    Mar. 21, 2024

(30) Foreign Application Priority Data

Sep. 21, 2022    (JP) ................................. 2022-149986

(51) Int. Cl.
| | |
|---|---|
| *H10B 43/35* | (2023.01) |
| *H10B 43/27* | (2023.01) |
| *H10B 43/40* | (2023.01) |
| *H10P 14/20* | (2026.01) |
| *H10P 90/00* | (2026.01) |

(52) U.S. Cl.
CPC ............. *H10B 43/35* (2023.02); *H10B 43/27* (2023.02); *H10B 43/40* (2023.02); *H10P 14/2905* (2026.01); *H10P 90/1914* (2026.01)

(58) Field of Classification Search
CPC ........ H10B 43/27; H10B 43/35; H10B 43/40; H01L 21/02381; H01L 21/2007; H01L 21/76254; H01L 21/76259; H10P 14/2905; H10P 90/1914; H10P 90/1916; H10P 90/1924; H10W 10/181
See application file for complete search history.

(56) References Cited

U.S. PATENT DOCUMENTS 5,980,633 A * 11/1999 Yamagata ......... H01L 21/76259
                                                    438/459
6,191,007 B1 * 2/2001 Matsui .............. H01L 21/76264
                                                    438/455
(Continued)

FOREIGN PATENT DOCUMENTS

JP        S63-041890 A    2/1988
JP        H01-217941 A    8/1989
(Continued)

*Primary Examiner* — Dale E Page
*Assistant Examiner* — Quovaunda Jefferson
(74) *Attorney, Agent, or Firm* — Foley & Lardner LLP

(57) ABSTRACT

A method for manufacturing a semiconductor device includes: forming a release layer including a first polycrystalline semiconductor layer provided on a first substrate, and a second polycrystalline semiconductor layer provided between the first substrate and the first polycrystalline semiconductor layer and having a p-type impurity concentration which is lower than that of the first polycrystalline semiconductor layer, and an n-type impurity concentration which is higher than that of the first polycrystalline semiconductor layer; subjecting the first polycrystalline semiconductor layer to anodic chemical conversion to form a first porous layer; forming a first device layer on the first porous layer; and bonding together the first device layer and a second device layer provided on a second substrate.

3 Claims, 5 Drawing Sheets

(56)  References Cited

U.S. PATENT DOCUMENTS

| | | | | |
|---|---|---|---|---|
| 6,211,038 | B1 * | 4/2001 | Nakagawa | ........ H01L 21/76259 |
| | | | | 438/409 |
| 6,214,701 | B1 * | 4/2001 | Matsushita | ........... H10F 71/127 |
| | | | | 438/455 |
| 6,258,698 | B1 | 7/2001 | Iwasaki et al. | |
| 6,406,952 | B2 * | 6/2002 | Bevk | .................... H10D 64/693 |
| | | | | 438/651 |
| 6,468,923 | B1 | 10/2002 | Yonehara et al. | |
| 8,053,776 | B2 * | 11/2011 | Ohashi | ................... H10B 63/80 |
| | | | | 257/65 |
| 2001/0019153 | A1 | 9/2001 | Sato et al. | |
| 2022/0059408 | A1 * | 2/2022 | Hayashi | ................. H10B 43/40 |
| 2022/0084868 | A1 | 3/2022 | Nakao | |

FOREIGN PATENT DOCUMENTS

| | | | |
|---|---|---|---|
| JP | H09-162090 | A | 6/1997 |
| JP | 2000-349266 | A | 12/2000 |
| JP | 3492142 | B2 | 11/2003 |
| JP | 5440549 | B2 | 3/2014 |
| JP | 5440550 | B2 | 3/2014 |
| JP | 2022-034881 | A | 3/2022 |
| JP | 2022-049603 | A | 3/2022 |
| TW | 202223977 | A | 6/2022 |

* cited by examiner

242 — 241(SGD)

242 — 241(WL(M-1))

242 — 241(WL0)

241(SGS)

METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-149986, filed Sep. 21, 2022, the entire contents of which are incorporated herein by reference.

FIELD

Embodiments described herein relate generally to a method for manufacturing a semiconductor device.

BACKGROUND

A semiconductor device is known which can be formed by bonding together a first device layer provided on a first substrate and a second device layer provided on a second substrate.

DESCRIPTION OF THE DRAWINGS

FIG. 2 is a schematic cross-sectional diagram illustrating a first example structure of a release layer.

DETAILED DESCRIPTION

Figures 1B, 1C, 1D, 1E:
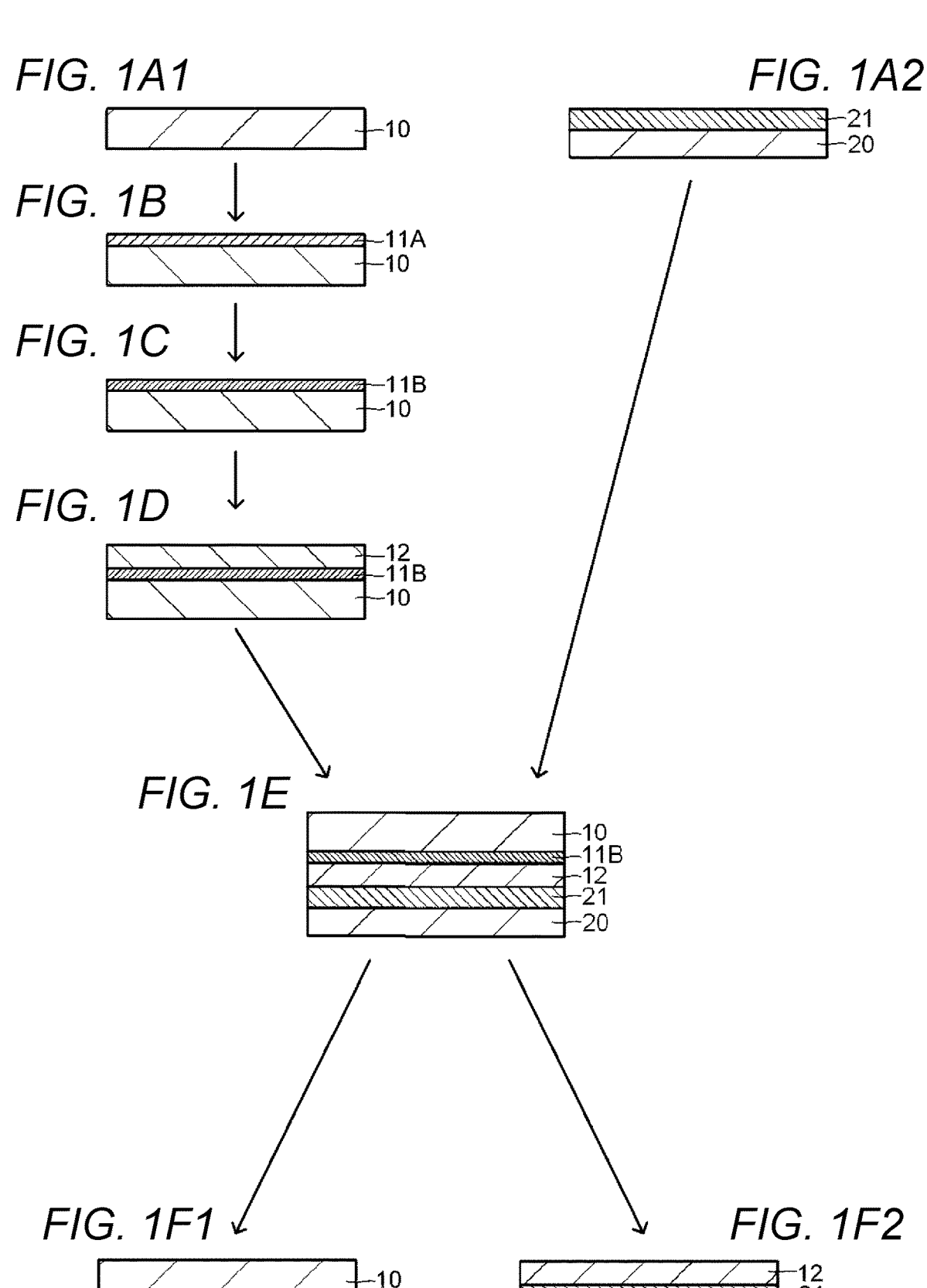
FIGS. 1A1 through 1F2 are schematic diagrams illustrating an example method for manufacturing a semiconductor device.

At least one embodiment provides a semiconductor device manufacturing method which can easily reuse a support substrate for bonding of device layers.

In general, according to at least one embodiment, a method for manufacturing a semiconductor device includes: forming a release layer including a first polycrystalline semiconductor layer provided on a first substrate, and a second polycrystalline semiconductor layer provided between the first substrate and the first polycrystalline semiconductor layer and having a p-type impurity concentration which is lower than that of the first polycrystalline semiconductor layer, and an n-type impurity concentration which is higher than that of the first polycrystalline semiconductor layer; subjecting the first polycrystalline semiconductor layer to anodic chemical conversion to form a first porous layer; forming a first device layer on the first porous layer; and bonding together the first device layer and a second device layer provided on a second substrate.

Embodiments of the present disclosure will now be described with reference to the drawings. The relationship between the thickness and planar dimensions of a component or element, the thickness ratio between components or elements, etc., described in the drawings, are not necessarily to scale. In the drawings and the description below, the same symbols are used for substantially the same components or elements, and a description thereof will sometimes be omitted.

As used herein, the term "connection" includes not only a physical connection but also an electrical connection unless otherwise indicated.

First Embodiment

FIGS. 1A1 through 1F2 are schematic diagrams illustrating an example method for manufacturing a semiconductor device. The following description illustrates an example method for manufacturing a NAND flash memory having a three-dimensional structure as an example.

Figure 2:
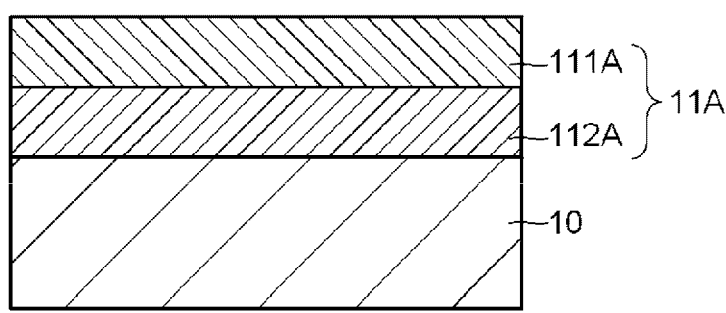

First, a substrate 10 such as a monocrystalline silicon substrate is prepared as a support substrate, while a device layer 21 including peripheral circuits, provided on a substrate 20 such as a monocrystalline silicon substrate, is prepared (FIGS. 1A1 and 1A2). Next, a release layer 11A including a semiconductor layer is formed on the substrate 10 (FIG. 1B). Next, an anodic chemical conversion treatment is performed on the release layer 11A to make at least part of the semiconductor layer of the release layer 11A porous, thereby forming a release layer 11B including a porous layer (FIG. 1C). Next, a device layer 12 including a memory cell array is formed on the release layer 11B (FIG. 1D). Next, the device layer 12 and the device layer 21 are made to face each other and bonded together (FIG. 1E). Next, the substrate 10 and the device layer 12 are separated via the release layer 11B (FIGS. 1F1 and 1F2). The separation may be performed physically using a method such as water jetting. The surface of each of the substrate 10 and the device layer 12, which are separated, is cleaned using a method such as wet etching and, when the release layer 11B partly remains on the surface, it is removed. Consequently, the substrate 10 can be reused as a support substrate for forming a new device layer 12 in the manufacturing of a semiconductor device. Thereafter, the stacked structure of the device layers 12 and 21 is divided into a plurality of semiconductor chips by a dicing process. Each semiconductor chip is a NAND flash memory. The foregoing is an example method for manufacturing a semiconductor device.

The anodic chemical conversion treatment is a processing method which involves immersing an object in a liquid chemical such as a hydrofluoric acid solution, and applying a voltage to the object to partially dissolve the object. If the substrate 10 is processed together with the semiconductor layer and becomes thin during the formation of the porous layer from the semiconductor layer by the anodic chemical conversion treatment, then it will be difficult to reuse the substrate 10 repeatedly as a support substrate.

A semiconductor device manufacturing method according to this embodiment comprises forming a release layer including a first polycrystalline semiconductor layer which is susceptible to anodic chemical conversion, and a second polycrystalline semiconductor layer which is provided between a substrate and the first polycrystalline semiconductor layer and which is insusceptible or little susceptible to anodic chemical conversion. The formation of such a release layer can prevent the substrate 10 from being unnecessarily processed by the anodic chemical conversion treatment. This can facilitate reuse of the substrate 10. Specific examples of the structure of the releaser layer will now be described.

First Example Structure of the Release Layer

FIG. 2 is a schematic cross-sectional diagram illustrating a first example structure of the release layer 11A. The release layer 11A shown in FIG. 2 includes a polycrystalline semiconductor layer 111A and a polycrystalline semiconductor layer 112A.

The polycrystalline semiconductor layer 111A is provided above the substrate 10. The substrate 10 is, for example, a semiconductor substrate such as a silicon wafer. Alternatively, the substrate 10 may be, for example, a glass substrate or an SiC substrate. An example of the polycrystalline semiconductor layer 111A is a polysilicon layer. The polycrystalline semiconductor layer 111A is a p-type semiconductor layer containing a p-type impurity that imparts p-type conductivity. An example of the p-type impurity is boron. The p-type impurity concentration of the polycrystalline semiconductor layer 111A is preferably, for example, not less than $1 \times 10^{18}$ cm$^{-3}$ and not more than $1 \times 10^{23}$ cm$^{-3}$. In the polycrystalline semiconductor layer 111A, the concentration of an n-type impurity that imparts n-type conductivity is preferably lower than the concentration of the p-type impurity and is, for example, not more than $1 \times 10^{16}$ cm$^{-3}$. An example of the n-type impurity is phosphorus or arsenic.

The polycrystalline semiconductor layer 112A is provided between the substrate 10 and the polycrystalline semiconductor layer 111A. The polycrystalline semiconductor layer 112A functions as a protective layer for preventing processing of the substrate 10 during the anodic chemical conversion treatment. An example of the polycrystalline semiconductor layer 112A is a polysilicon layer. The polycrystalline semiconductor layer 112A is an n-type semiconductor layer containing an n-type impurity. An example of the n-type impurity is phosphorus or arsenic. The n-type impurity concentration of the polycrystalline semiconductor layer 112A is preferably, for example, not less than $1 \times 10^{18}$ cm$^{-3}$ and not more than $1 \times 10^{23}$ cm$^{-3}$. In the polycrystalline semiconductor layer 112A, the concentration of a p-type impurity is preferably lower than the concentration of the n-type impurity. The p-type impurity concentration of the polycrystalline semiconductor layer 112A is, for example, not more than $1 \times 10^{16}$ cm$^{-3}$. The p-type impurity concentration of the polycrystalline semiconductor layer 112A is preferably lower than the p-type impurity concentration of the polycrystalline semiconductor layer 111A.

The concentration of an n-type impurity and the concentration of a p-type impurity may be measured using, for example, secondary ion mass spectrometry (SIMS). The n-type impurity concentration of the polycrystalline semiconductor layer 111A may be a value which is not more than the SIMS detection limit.

The thickness of the release layer 11A is, for example, not less than 1 μm and not more than 20 μm. The thickness of the polycrystalline semiconductor layer 111A is, for example, not less than 0.2 μm and not more than 15 μm. The thickness of the polycrystalline semiconductor layer 112A is, for example, not less than 0.2 μm and not more than 15 μm.

The polycrystalline semiconductor layer 111A and the polycrystalline semiconductor layer 112A may be formed by successively forming a first amorphous semiconductor film doped with an n-type impurity and a second amorphous semiconductor film doped with a p-type impurity using, for example, a low-pressure plasma-enhanced chemical vapor deposition (LP-CVD) process, and then crystallizing the amorphous semiconductor films using a method such as heat treatment. Alternatively, the polycrystalline semiconductor layer 111A and the polycrystalline semiconductor layer 112A may be formed by introducing an n-type impurity and a p-type impurity into an amorphous semiconductor film in a controlled manner in the depth direction using an ion implantation method, and then crystallizing the amorphous semiconductor film. An example of such an amorphous semiconductor film is an amorphous silicon film. The amounts of the n-type impurity and the p-type impurity introduced vary depending on the flow rate of a source gas containing the p-type impurity and the film-forming temperature of the amorphous semiconductor film. The higher the film-forming rate, the lower the concentrations of the n-type impurity and the p-type impurity. Such an amorphous semiconductor film may be formed either in a batchwise manner or in a one-by-one manner.

Figure 3:
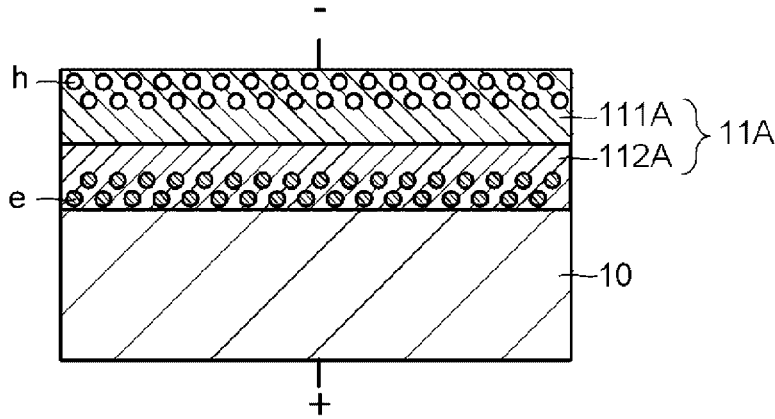
FIG. 3 is a schematic cross-sectional diagram illustrating an example of an anodic chemical conversion treatment of the first example structure of the release layer.
Figure 4:
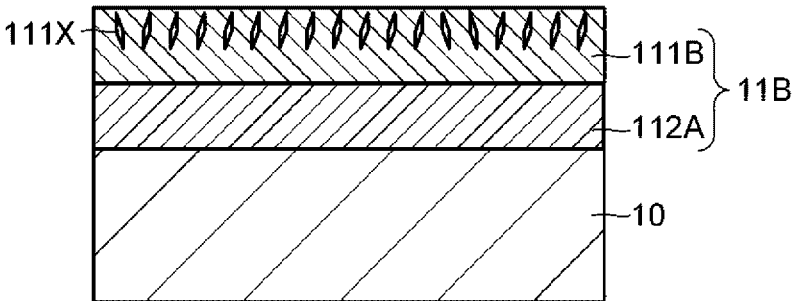
FIG. 4 is a schematic cross-sectional diagram illustrating the example of anodic chemical conversion treatment of the first example structure of the release layer.

FIGS. 3 and 4 are schematic cross-sectional diagrams illustrating an example of an anodic chemical conversion treatment of the first example structure of the release layer 11A. The application of a voltage to the release layer 11A is performed by applying a positive potential to the substrate 10 side of the release layer 11A and applying a negative potential to the opposite side of the release layer 11A as shown in FIG. 3 using, for example, electrodes. The voltage value may be appropriately set according to parameters such as the porosity of the intended porous layer to be formed.

The polycrystalline semiconductor layer 111A which is a p-type semiconductor layer and the polycrystalline semiconductor layer 112A which is an n-type semiconductor layer form a PN junction; therefore, holes "h" gather in the polycrystalline semiconductor layer 111A which is a p-type semiconductor layer, while electrons "e" gather in the polycrystalline semiconductor layer 112A which is an n-type semiconductor layer. A depletion region is formed between the hole-rich region and the electron-rich region.

The polycrystalline semiconductor layer 111A has a larger number of holes "h" than the polycrystalline semiconductor layer 112A, and therefore is susceptible to anodic chemical conversion to become porous, forming a porous layer 111B having pores 111X. A release layer 11B is thus formed. The porous layer 111B corresponds to the polycrystalline semiconductor layer 111A that became porous. The formation of pores preferably occurs in the entire surface of the polycrystalline semiconductor layer 111A. The impurity concentration and the thickness of the polycrystalline semiconductor layer 111A do not change significantly with the formation of pores in the polycrystalline semiconductor layer. Thus, the thickness and impurity concentration of the porous layer 111B are substantially the same as those of the polycrystalline semiconductor layer 111A.

On the other hand, the polycrystalline semiconductor layer 112A has a smaller number of holes "h" than the polycrystalline semiconductor layer 111A, and therefore is less susceptible to anodic chemical conversion than the polycrystalline semiconductor layer 111A. Accordingly, at least part of the polycrystalline semiconductor layer 112A remains as the polycrystalline semiconductor layer 112A. Even when the polycrystalline semiconductor layer 112A is made porous, the porosity of the porous layer of the polycrystalline semiconductor layer 112A is lower than the porosity of the porous layer 111B. The porosity can be defined, for example, as the percentage of pores (%).

In the semiconductor device manufacturing method using the release layer 11A having the first example structure, a stack of the polycrystalline semiconductor layer 111A which is a p-type semiconductor layer and the polycrystalline semiconductor layer 112A which is an n-type semiconductor layer is formed, and a reverse bias voltage is applied to the stack. Since the anodic chemical conversion of the polycrystalline semiconductor layer 112A can be reduced or prevented, the polycrystalline semiconductor layer 112A functions as a protective layer and can reduce or prevent processing of the substrate 10 during the anodic chemical conversion treatment. This can facilitate reuse of the substrate 10 as a support substrate.

Second Example Structure of the Release Layer

Figure 5:
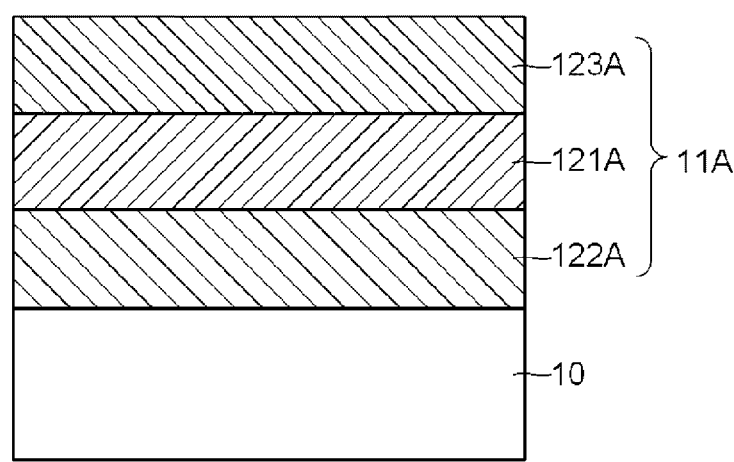
FIG. 5 is a schematic cross-sectional diagram illustrating a second example structure of the release layer.

The structure of the release layer 11A is not limited to the first example structure. FIG. 5 is a schematic cross-sectional diagram illustrating a second example structure of the release layer 11A. The release layer 11A shown in FIG. 5 includes a polycrystalline semiconductor layer 121A, a polycrystalline semiconductor layer 122A, and a polycrystalline semiconductor layer 123A.

The polycrystalline semiconductor layer 121A is provided above the substrate 10. The substrate 10 is, for example, a semiconductor substrate such as a silicon wafer. Alternatively, the substrate 10 may be, for example, a glass substrate or an SiC substrate. An example of the polycrystalline semiconductor layer 121A is a polysilicon layer. The polycrystalline semiconductor layer 121A is a p-type semiconductor layer containing a p-type impurity. An example of the p-type impurity is boron. The p-type impurity concentration of the polycrystalline semiconductor layer 121A is preferably higher than the p-type impurity concentration of the polycrystalline semiconductor layer 122A and the p-type impurity concentration of the polycrystalline semiconductor layer 123A, and is preferably, for example, not less than $1\times10^{20}$ cm$^{-3}$ and not more than $1\times10^{23}$ cm$^{-3}$. In the polycrystalline semiconductor layer 121A, the concentration of an n-type impurity is preferably lower than the concentration of the p-type impurity and is preferably, for example, not more than $1\times10^{18}$ cm$^{-3}$.

The polycrystalline semiconductor layer 122A is provided between the substrate 10 and the polycrystalline semiconductor layer 121A. The polycrystalline semiconductor layer 122A functions as a protective layer for preventing processing of the substrate 10 during the anodic chemical conversion treatment. An example of the polycrystalline semiconductor layer 122A is a polysilicon layer. The polycrystalline semiconductor layer 122A is a p-type semiconductor layer containing a p-type impurity. An example of the p-type impurity is boron. The p-type impurity concentration of the polycrystalline semiconductor layer 122A is preferably lower than the p-type impurity concentration of the polycrystalline semiconductor layer 121A and is preferably, for example, not less than $1\times10^{20}$ cm$^{-3}$ and not more than $1\times10^{23}$ cm$^{-3}$. In the polycrystalline semiconductor layer 122A, the concentration of an n-type impurity is preferably lower than the concentration of the p-type impurity and is preferably, for example, not more than $1\times10^{18}$ cm$^{-3}$.

The polycrystalline semiconductor layer 123A is provided on the polycrystalline semiconductor layer 121A. The polycrystalline semiconductor layer 123A functions as a support layer for supporting the substrate 10 or the substrate 20 upon boding of the device layer 12 and the device layer 21. The provision of the polycrystalline semiconductor layer 123A can enhance the flatness of the release layer 11A. An example of the polycrystalline semiconductor layer 123A is a polysilicon layer. The polycrystalline semiconductor layer 123A is a p-type semiconductor layer containing a p-type impurity. An example of the p-type impurity is boron. The p-type impurity concentration of the polycrystalline semiconductor layer 123A is preferably lower than the p-type impurity concentration of the polycrystalline semiconductor layer 121A and is preferably, for example, not less than $1\times10^{20}$ cm$^{-3}$ and not more than $1\times10^{23}$ cm$^{-3}$. In the polycrystalline semiconductor layer 123A, the concentration of an n-type impurity is preferably lower than the concentration of the p-type impurity and is preferably, for example, not more than $1\times10^{18}$ cm$^{-3}$.

The concentration of an n-type impurity and the concentration of a p-type impurity may be measured using, for example, SIMS. The n-type impurity concentration of each of the polycrystalline semiconductor layer 121A, the polycrystalline semiconductor layer 122A and the polycrystalline semiconductor layer 123A may be a value which is not more than the SIMS detection limit.

In the second example structure, the thickness of the release layer 11A is, for example, not less than 1 μm and not more than 20 μm. The thickness of the polycrystalline semiconductor layer 121A is, for example, not less than 0.2 μm and not more than 15 μm. The thickness of the polycrystalline semiconductor layer 122A is, for example, not less than 0.2 μm and not more than 15 μm. The thickness of the polycrystalline semiconductor layer 123A is, for example, not less than 0.2 μm and not more than 15 μm.

The average crystal grain size of the polycrystalline semiconductor layer 121A is preferably smaller than each of the average crystal grain size of the polycrystalline semiconductor layer 122A and the average crystal grain size of the polycrystalline semiconductor layer 123A. The smaller the average crystal grain size, the larger the number of grain boundaries; therefore, more pores are formed along the grain boundaries by anodic chemical conversion. The average crystal grain size of the polycrystalline semiconductor layer 121A is preferably, for example, not less than 100 nm and not more than 1000 nm. The average crystal grain size of the polycrystalline semiconductor layer 122A is preferably, for example, not less than 10 nm and not more than 100 nm. The average crystal grain size of the polycrystalline semiconductor layer 123A is preferably, for example, not less than 10 nm and not more than 100 nm. The respective average crystal grain sizes may be determined by measuring the diameters of a plurality of crystal grains through cross-sectional observation using, for example, a scanning electron microscope (SEM) or a transmission electron microscope (TEM).

The polycrystalline semiconductor layer 121A, the polycrystalline semiconductor layer 122A and the polycrystalline semiconductor layer 123A may be formed by successively forming first to third amorphous semiconductor layers doped with a p-type impurity using, for example, LP-CVD, and then crystallizing the amorphous semiconductor layers using a method such as heat treatment. Alternatively, the polycrystalline semiconductor layer 121A, the polycrystalline semiconductor layer 122A and the polycrystalline semiconductor layer 123A may be formed by introducing a p-type impurity into an amorphous semiconductor layer using an ion implantation method while controlling the amount of the p-type impurity in the depth direction to form first to third amorphous semiconductor layers, and then crystallizing the amorphous semiconductor layers. An example of each of the first to third amorphous semiconductor layers is an amorphous silicon film. The amounts of the n-type impurity and the p-type impurity introduced vary depending on the flow rate of a source gas containing the p-type impurity and the film-forming temperature of the amorphous semiconductor film. The higher the film-forming rate, the lower the concentrations of the n-type impurity and the p-type impurity. The amorphous semiconductor films may be formed either in a batchwise manner or in a one-by-one manner.

Figure 6:
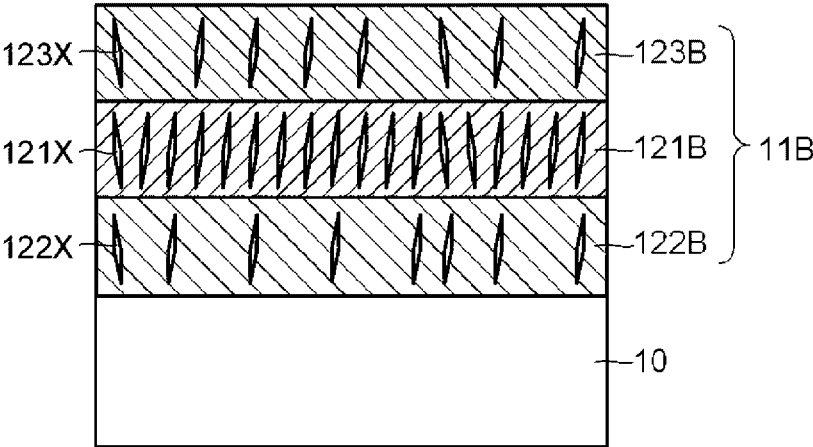
FIG. 6 is a schematic cross-sectional diagram illustrating an example of an anodic chemical conversion treatment of the second example structure of the release layer.

FIG. 6 is a schematic cross-sectional diagram illustrating an example of an anodic chemical conversion treatment of the second example structure of the release layer 11A. The application of a voltage to the release layer 11A is performed by applying a negative potential to the substrate 10 side of the release layer 11A and applying a positive potential to the opposite side of the substrate 10 of the release layer 11A. The voltage application causes anodic chemical conversion in each of the polycrystalline semiconductor layer 121A, the polycrystalline semiconductor layer 122A and the polycrystalline semiconductor layer 123A to form pores in the respective layers, thus forming a porous layer 121B having pores 121X, a porous layer 122B having pores 122X, and a porous layer 123B having pores 123X. The formation of pores preferably occurs in the entire surface of the polycrystalline semiconductor layer 121A. A release layer 11B is thus formed. The lower the concentration of a p-type impurity, the lower the etching rate in the anodic chemical conversion treatment. Therefore, the porosity of the porous layer 122B and the porosity of the porous layer 123B are each lower than the porosity of the porous layer 121B. The porosity can be defined, for example, as the percentage of pores (%).

In the semiconductor device manufacturing method using the release layer 11A having the second example structure, the polycrystalline semiconductor layer 121A having a high p-type impurity concentration and the polycrystalline semiconductor layers 122A and 123A having a low p-type impurity concentration are formed, and a voltage is applied to the layers. Since the anodic chemical conversion of the polycrystalline semiconductor layer 122A can be reduced or prevented, the porous layer 122B functions as a protective layer and can reduce or prevent processing of the substrate 10 during the anodic chemical conversion treatment. This can facilitate reuse of the substrate 10 as a support substrate. The second example structure can be combined with the first example structure in an appropriate manner.

Second Embodiment

Figure 7:
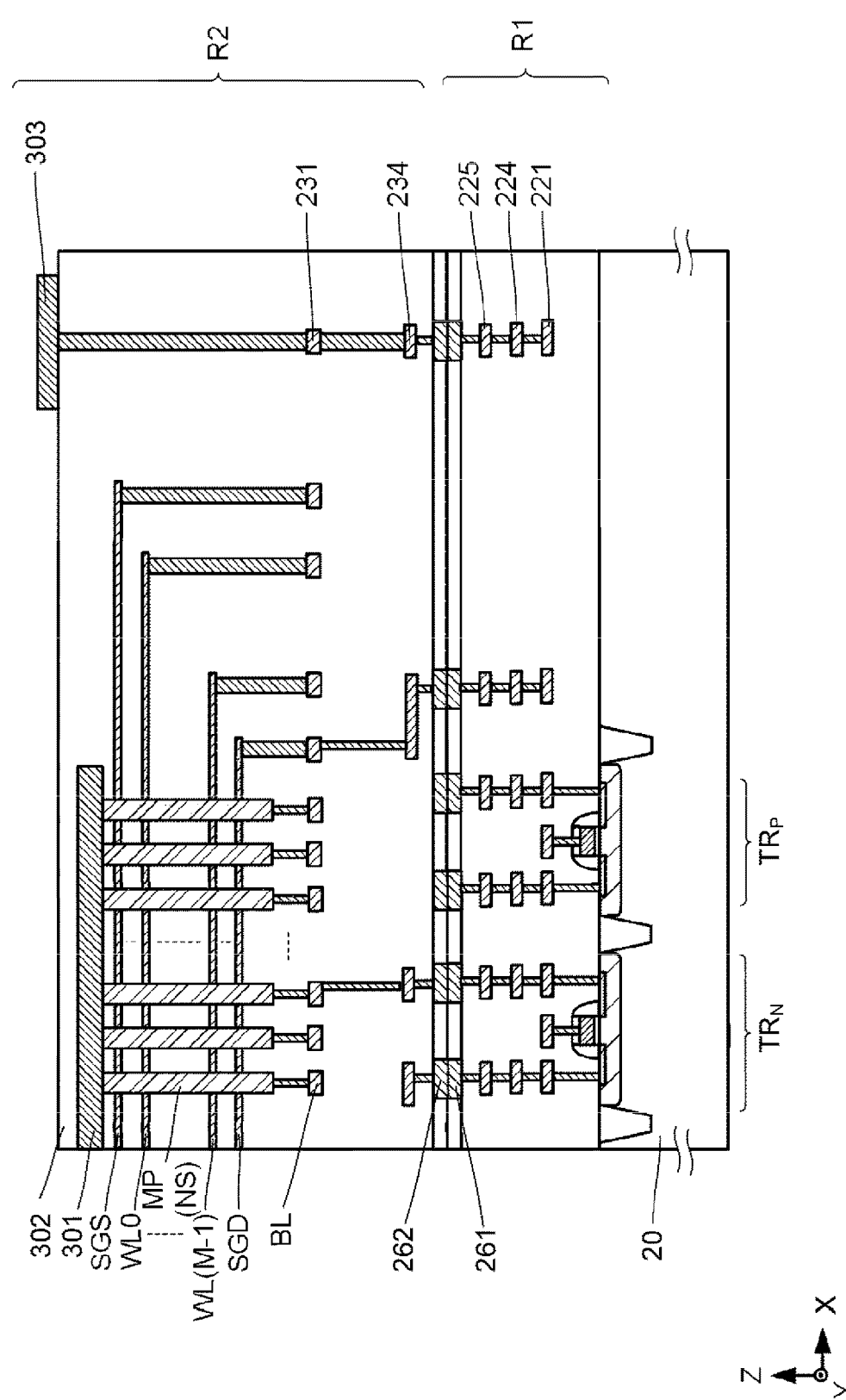
FIG. 7 is a schematic cross-sectional diagram showing an example structure of a semiconductor device.

A second embodiment, which relates to an example structure of a semiconductor device which can be manufactured by the semiconductor device manufacturing method according to the first embodiment, will now be described. FIG. 7 is a schematic cross-sectional diagram showing an example structure of a semiconductor device. FIG. 7 also shows an X-axis direction along the surface of a substrate 20, a Y-axis direction along the substrate surface and substantially perpendicular to the X-axis direction, and a Z-axis direction substantially perpendicular to the substrate surface.

The semiconductor device 1 shown in FIG. 7 includes the substrate 20, a region R1, and a region R2. The substrate 20 is, for example, a silicon substrate. The region R1 is a region having the peripheral circuits of the device layer 21 of FIG. 1. The region R2 is a region having the memory cell array of the device layer 12 of FIG. 1. FIG. 7 shows a field-effect transistor (FET) $TR_N$ and a field-effect transistor $TR_P$, provided in the substrate 20, conductive layers 221, conductive layers 224, conductive layers 225, memory pillars MP, a select gate line SGS, word lines WL (word lines WL0 to WL(M<1) (M is an integer)), a select gate line SGD, bit lines BL, conductive layers 231, conductive layers 234, connection pads 261, and connection pads 262.

The field-effect transistor $TR_N$ is an N-channel transistor. The field-effect transistor $TR_P$ is a P-channel transistor. A field-effect transistor, such as the field-effect transistor $TR_N$ or the field-effect transistor $TR_P$, is an ultra-low voltage transistor intended for high-speed operation, and may be applied, for example, in a peripheral circuit capable of low-voltage driving and high-speed operation. Each of the field-effect transistors $TR_N$ and $TR_P$ constitutes one of the above-described peripheral circuits.

Figure 8:
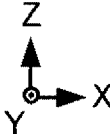
FIG. 8 is a schematic cross-sectional diagram showing an example structure of a memory pillar.

The memory pillars MP penetrate a stacked structure including the select gate line SGS, the word lines WL, and the select gate line SGD, and are connected to an interconnect layer 301, and connected to not-shown source lines SL via the interconnect layer 301. An example structure of the memory pillars MP will now be described. FIG. 8 is a schematic cross-sectional diagram showing an example structure of each memory pillar MP. FIG. 8 shows conductive layers 241, insulating layers 242, a block insulating film 251, a charge storage film 252, a tunnel insulating film 253, a semiconductor layer 254, a core insulating layer 255, a cap layer 256, and a conductive layer 231.

The conductive layers 241 and the insulating layers 242 are alternately stacked and constitute a stacked structure. The conductive layers 241 constitute the select gate line SGS, the word lines WL, and the select gate line SGD. The conductive layers 241 comprise a metal material. The insulating layers 242 comprise, for example, oxygen and silicon.

The block insulating film 251, the charge storage film 252, the tunnel insulating film 253, the semiconductor layer 254, and the core insulating layer 255 constitute the memory pillar MP. The components of the memory pillar MP extend in the Z-axis direction. One memory pillar MP corresponds to one NAND string NS. The block insulating film 251, the charge storage film 252, and the tunnel insulating film 253 constitute a memory layer between the semiconductor layer 254 and the stacked structure including the conductive layers 241 and the insulating layers 242.

The block insulating film 251, the tunnel insulating film 253, and the core insulating layer 255 comprise, for example, oxygen and silicon. The charge storage film 252 comprises, for example, nitrogen and silicon. The semiconductor layer 254 and the cap layer 256 comprise, for example, polysilicon.

More specifically, a hole is formed which penetrates the conductive layer 241 and corresponds to the memory pillar MP. The block insulating film 251, the charge storage film 252, and the tunnel insulating film 253 are stacked in this order on the side surface of the hole. The semiconductor layer 254 is formed such that its side surface is in contact with the tunnel insulating film 253.

The semiconductor layer 254 penetrates the stacked structure including the conductive layers 241 and the insulating layers 242 in the Z-axis direction. The semiconductor layer 254 has channel regions of a first select transistor, a second select transistor, and memory transistors. Thus, the semiconductor layer 254 functions as a signal line that connects current pathways of the first select transistor, the second select transistor, and the memory transistors.

The core insulating layer 255 is provided inside the semiconductor layer 254. The core insulating layer 255 extends along the semiconductor layer 254.

The cap layer 256 is provided on the semiconductor layer 254 and the core insulating layer 255, and is in contact with the tunnel insulating film 253.

One of the conductive layers 231 is in contact with the cap layer 256 via a contact plug. One of the conductive layers 231 constitutes a bit line BL. Another one of the conductive layers 231 is connected to a bonding pad 303 via a contact plug that penetrates an insulating layer 302 comprising oxygen and silicon. The conductive layers 231 and the bonding pad 303 comprise a metal material.

A memory pillar MP and a conductive layer 241 constituting a word line WL constitute a memory transistor. The memory pillar MP and the conductive layer 241 constituting the select gate line SGD constitute a first select transistor. The memory pillar MP and the conductive layer 241 constituting the select gate line SGS constitute a second select transistor.

One of the conductive layers 225 is connected to the source or drain of a field-effect transistor such as the field-effect transistor TRN or the field-effect transistor TR P via a contact plug, a conductive layer 221 and a conductive layer 224.

One of the conductive layers 234 is connected to the interconnect layer 301 via a contact plug and the conductive layer 231. Another one of the conductive layers 234 is connected to a bit line BL via a contact plug. Yet another one of the conductive layers 234 is connected to the select gate line SGS, word lines WL, or the select gate line SGD via a contact plug and the conductive layer 231.

The connection pads 261 are substrate 20-side connection pads. Each connection pad 261 is connected to a conductive layer 225 via a contact plug. The connection pads 261 comprise a metal material such as copper or a copper alloy.

The connection pads 262 are each connected to the conductive layer 234 via a contact plug. The connection pads 262 comprise a metal material such as copper or a copper alloy.

Each connection pad 261 and each connection pad 262 are directly bonded together by, for example, intermetallic elemental diffusion, Van der Waals forces, or recrystallization due to volume expansion or melting. The device layer 12 and the device layer 21, shown in FIG. 1, can be directly bonded together by, for example, elemental diffusion between insulators, Van der Waals forces, or a chemical reaction such as dehydration condensation or polymerization.

While certain embodiments have been described, these embodiments have been presented by way of example only, and are not intended to limit the scope of the disclosure.

Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A method for manufacturing a semiconductor device, comprising:
   forming a release layer including a first polycrystalline semiconductor layer, a second polycrystalline semiconductor layer, and a third polycrystalline semiconductor layer, the first polycrystalline semiconductor layer disposed on a first substrate, the second polycrystalline semiconductor layer disposed between the first substrate and the first polycrystalline semiconductor layer, the second polycrystalline semiconductor layer having a p-type impurity concentration lower than that of the first polycrystalline semiconductor layer, the third polycrystalline semiconductor layer disposed on the first polycrystalline semiconductor layer, the third polycrystalline semiconductor layer having a p-type impurity concentration lower than that of the first polycrystalline semiconductor layer;
   forming a first porous layer, a second porous layer, and a third porous layer by subjecting the first polycrystalline semiconductor layer, the second polycrystalline semiconductor layer, and the third polycrystalline semiconductor layer to anodic chemical conversion, respectively;
   forming a first device layer on the third porous layer; and
   bonding together the first device layer and a second device layer disposed on a second substrate.

2. The method for manufacturing a semiconductor device according to claim 1, wherein a porosity of the second porous layer and a porosity of the third porous layer are each lower than a porosity of the first porous layer.

3. The method for manufacturing a semiconductor device according to claim 1, wherein an average crystal grain size of the first polycrystalline semiconductor layer is smaller than each of the average crystal grain size of the second polycrystalline semiconductor layer and the average crystal grain size of the third polycrystalline semiconductor layer.

* * * * *